(12) United States Patent
Anc et al.

(10) Patent No.: US 10,374,137 B2
(45) Date of Patent: Aug. 6, 2019

(54) LIGHT CONVERTER ASSEMBLIES WITH ENHANCED HEAT DISSIPATION

(71) Applicants: OSRAM GmbH, Munich (DE); OSRAM Opto Semiconductors GmbH, Regensburg (DE)

(72) Inventors: Maria Anc, Groveland, MA (US); Alan Lenef, Belmont, MA (US)

(73) Assignees: OSRAM GmbH, München (DE); OSRAM Opto Semiconductors GmbH, Regensburg (DE)

( * ) Notice: Subject to any disclaimer, the term of this patent is extended or adjusted under 35 U.S.C. 154(b) by 207 days.

(21) Appl. No.: 15/118,075

(22) PCT Filed: Mar. 10, 2015

(86) PCT No.: PCT/US2015/019762
§ 371 (c)(1),
(2) Date: Aug. 10, 2016

(87) PCT Pub. No.: WO2015/138495
PCT Pub. Date: Sep. 17, 2015

(65) Prior Publication Data
US 2016/0369954 A1    Dec. 22, 2016

Related U.S. Application Data

(60) Provisional application No. 61/950,920, filed on Mar. 11, 2014.

(51) Int. Cl.
*H01L 33/50*    (2010.01)
*B32B 3/02*    (2006.01)
(Continued)

(52) U.S. Cl.
CPC .............. *H01L 33/642* (2013.01); *B32B 3/02* (2013.01); *B32B 3/10* (2013.01); *B32B 7/027* (2019.01);
(Continued)

(58) Field of Classification Search
None
See application file for complete search history.

(56) References Cited

U.S. PATENT DOCUMENTS 4,543,510 A * 9/1985 Chiba ..................... H01J 29/89
                                                                      313/35
6,062,461 A * 5/2000 Sparks ................ B81C 1/00269
                                                                      228/123.1
(Continued)

FOREIGN PATENT DOCUMENTS

JP    2005311170 A * 11/2005 ........... H01L 33/486
JP    2008192909 A *  8/2008
(Continued)

OTHER PUBLICATIONS

Machine Translation for JP 2013074273 A, Apr. 2013 (Year: 2013).*
(Continued)

*Primary Examiner* — Jeffrey A Vonch
(74) *Attorney, Agent, or Firm* — Slater Matsil, LLP

(57) ABSTRACT

The present disclosure is directed to light converter assemblies with enhanced heat dissipation. A light converter assembly may comprise a confinement material applied to at least a first substrate and a phosphor material also deposited on the first substrate so as to be surrounded by the confinement material. The first substrate may be hermetically sealed to a second substrate using the confinement material so that the phosphor material is confined between the substrates and protected from atmospheric contamination. The substrates may comprise, for example, sapphire to allow for light beam
(Continued)

transmission and heat conductance. Confinement materials that may be employed to seal the first substrate to the second substrate may include, for example, silicon or a metal (e.g., silver, copper, aluminum, etc.) The phosphor material may comprise, for example, at least one quantum dot material.

23 Claims, 8 Drawing Sheets

(51) Int. Cl.
  B32B 3/10       (2006.01)
  B32B 3/24       (2006.01)
  B32B 7/027      (2019.01)
  B32B 7/04       (2019.01)
  C04B 35/115     (2006.01)
  F21K 9/64       (2016.01)
  H01L 33/64      (2010.01)
  F21Y 115/30     (2016.01)
  F21V 29/83      (2015.01)
  B32B 15/04      (2006.01)
  B32B 18/00      (2006.01)
  B32B 3/26       (2006.01)
  B32B 7/12       (2006.01)
  B32B 15/20      (2006.01)

(52) U.S. Cl.
  CPC .................. *B32B 7/04* (2013.01); *F21K 9/64* (2016.08); *H01L 33/502* (2013.01); *H01L 33/505* (2013.01); *H01L 33/507* (2013.01); *H01L 33/508* (2013.01); *H01L 33/644* (2013.01); *B32B 3/266* (2013.01); *B32B 7/12* (2013.01); *B32B 15/04* (2013.01); *B32B 15/043* (2013.01); *B32B 15/20* (2013.01); *B32B 18/00* (2013.01); *B32B 2250/44* (2013.01); *B32B 2255/20* (2013.01); *B32B 2255/205* (2013.01); *B32B 2255/28* (2013.01); *B32B 2307/302* (2013.01); *B32B 2307/412* (2013.01); *B32B 2307/416* (2013.01); *B32B 2307/422* (2013.01); *B32B 2311/08* (2013.01); *B32B 2315/02* (2013.01); *F21V 29/83* (2015.01); *F21Y 2115/30* (2016.08); *H01L 33/501* (2013.01); *Y10T 428/24777* (2015.01)

(56) References Cited

U.S. PATENT DOCUMENTS

| | | | | |
|---|---|---|---|---|
| 7,196,354 B1* | 3/2007 | Erchak | H01L 33/507 | 257/79 |
| 8,508,126 B1* | 8/2013 | Morejon | F21V 9/30 | 313/506 |
| 2003/0104651 A1* | 6/2003 | Kim | B81C 1/00269 | 438/106 |
| 2004/0076016 A1* | 4/2004 | Sato | H01L 33/20 | 362/555 |
| 2006/0279950 A1* | 12/2006 | Hama | A61B 1/0653 | 362/257 |
| 2007/0064131 A1* | 3/2007 | Sawanobori | H01L 33/505 | 348/294 |
| 2007/0273274 A1* | 11/2007 | Horiuchi | C09K 11/06 | 313/504 |
| 2008/0101071 A1* | 5/2008 | Imai | H01L 33/64 | 362/294 |
| 2008/0111145 A1* | 5/2008 | Lin | H01L 33/507 | 257/98 |
| 2008/0116473 A1* | 5/2008 | Sugiyama | H01L 33/483 | 257/98 |
| 2008/0123339 A1* | 5/2008 | Bierhuizen | H01L 33/644 | 362/293 |
| 2008/0150112 A1* | 6/2008 | Hu | H01L 25/0657 | 257/686 |
| 2008/0187746 A1* | 8/2008 | De Graaf | C04B 35/6261 | 428/332 |
| 2009/0003400 A1* | 1/2009 | Nagahama | H01L 33/483 | 372/50.23 |
| 2009/0039365 A1* | 2/2009 | Andrews | H01L 33/504 | 257/98 |
| 2009/0095960 A1* | 4/2009 | Murayama | H01L 25/0753 | 257/79 |
| 2009/0154137 A1* | 6/2009 | Bierhuizen | H01L 25/0753 | 362/84 |
| 2009/0309177 A1* | 12/2009 | Jeung | H01L 27/14618 | 257/432 |
| 2009/0322197 A1* | 12/2009 | Helbing | H01L 33/507 | 313/46 |
| 2009/0322205 A1* | 12/2009 | Lowery | H01L 33/507 | 313/493 |
| 2009/0322208 A1* | 12/2009 | Shaikevitch | H01L 33/507 | 313/503 |
| 2010/0003772 A1* | 1/2010 | Carlson | B81C 1/00269 | 438/18 |
| 2010/0133556 A1* | 6/2010 | Li | F21K 9/00 | 257/88 |
| 2010/0283036 A1* | 11/2010 | Coe-Sullivan | H05B 33/145 | 257/13 |
| 2010/0328925 A1* | 12/2010 | Hoelen | F21V 14/08 | 362/84 |
| 2010/0328926 A1* | 12/2010 | Hoelen | C09K 11/7774 | 362/84 |
| 2011/0001157 A1* | 1/2011 | McKenzie | H01L 33/507 | 257/98 |
| 2011/0025192 A1* | 2/2011 | Ansems | F21K 9/62 | 313/501 |
| 2011/0037926 A1* | 2/2011 | Tsukahara | G02B 6/0023 | 349/64 |
| 2011/0044026 A1* | 2/2011 | Deeben | H01L 33/508 | 362/84 |
| 2011/0215700 A1* | 9/2011 | Tong | F21V 3/02 | 313/46 |
| 2011/0227108 A1* | 9/2011 | Tetz | H01L 33/507 | 257/98 |
| 2011/0266580 A1* | 11/2011 | Nicole | H01L 33/505 | 257/98 |
| 2011/0299044 A1* | 12/2011 | Yeh | H04N 9/315 | 353/52 |
| 2011/0309325 A1* | 12/2011 | Park | H01L 25/0753 | 257/13 |
| 2011/0317397 A1* | 12/2011 | Trottier | H01L 33/502 | 362/84 |
| 2012/0057325 A1* | 3/2012 | Hikmet | H01L 33/58 | 362/19 |
| 2012/0057364 A1* | 3/2012 | Kishimoto | F21V 29/004 | 362/538 |
| 2012/0068213 A1* | 3/2012 | Zhang | B32B 18/00 | 257/98 |
| 2012/0069547 A1 | 3/2012 | Gielen et al. | | |
| 2012/0087124 A1* | 4/2012 | Ravillisetty | C09K 11/0883 | 362/235 |
| 2012/0094406 A1* | 4/2012 | Patel | H01L 33/505 | 438/27 |
| 2012/0104442 A1* | 5/2012 | Kuo | H01L 33/507 | 257/98 |
| 2012/0147588 A1 | 6/2012 | Yang | | |
| 2012/0153345 A1* | 6/2012 | Ozaki | H01L 33/507 | 257/100 |
| 2012/0261703 A1* | 10/2012 | Zimmerman | H01L 33/502 | 257/98 |
| 2012/0267661 A1* | 10/2012 | Kim | H01L 33/486 | 257/98 |
| 2012/0313075 A1* | 12/2012 | Linton | G02B 1/002 | 257/13 |
| 2012/0314411 A1* | 12/2012 | Nagasaki | F21V 9/00 | 362/231 |
| 2013/0010492 A1* | 1/2013 | Montgomery | G03B 21/204 | 362/553 |

(56) References Cited

U.S. PATENT DOCUMENTS

| | | | |
|---|---|---|---|
| 2013/0094176 A1* | 4/2013 | Deeman | F21V 9/30 362/84 |
| 2013/0100635 A1* | 4/2013 | Xu | F21V 9/00 362/19 |
| 2013/0175558 A1* | 7/2013 | Orsley | H01L 33/644 257/88 |
| 2013/0200785 A1* | 8/2013 | Yano | H05B 33/02 313/512 |
| 2013/0250544 A1* | 9/2013 | Zink | H01L 33/505 362/84 |
| 2013/0257264 A1* | 10/2013 | Tamaki | B05D 5/06 313/503 |
| 2013/0258637 A1* | 10/2013 | Wang | H01L 33/505 362/84 |
| 2013/0277643 A1* | 10/2013 | Williamson | H01L 27/156 257/13 |
| 2014/0021501 A1* | 1/2014 | Chen | H01L 33/44 362/84 |
| 2014/0021503 A1* | 1/2014 | Yoshida | H01L 33/507 257/98 |
| 2014/0133146 A1* | 5/2014 | Ryu | C09K 11/0883 362/235 |
| 2014/0151729 A1* | 6/2014 | Orsley | H01L 33/505 257/98 |
| 2014/0177663 A1* | 6/2014 | Finsterbusch | H01S 5/1017 372/45.01 |
| 2014/0179037 A1* | 6/2014 | Lai | H01L 33/507 438/27 |
| 2014/0226308 A1* | 8/2014 | Fukuda | H01L 33/507 362/84 |
| 2014/0226317 A1* | 8/2014 | Livesay | H01L 33/641 362/147 |
| 2014/0242306 A1* | 8/2014 | Koval | C03B 23/245 428/34 |
| 2014/0346547 A1* | 11/2014 | Park | H01L 33/507 257/98 |
| 2014/0367633 A1* | 12/2014 | Bibl | G02F 1/133603 257/13 |
| 2015/0048403 A1* | 2/2015 | Dan | H01L 51/5246 257/98 |
| 2015/0062955 A1* | 3/2015 | Sorg | F21K 9/56 362/553 |
| 2015/0070907 A1* | 3/2015 | Hagemann | C09K 11/7721 362/343 |
| 2015/0115304 A1* | 4/2015 | Singer | F21V 9/30 257/98 |
| 2015/0129916 A1* | 5/2015 | Bera | H01L 33/504 257/98 |
| 2015/0155450 A1* | 6/2015 | Oka | H01L 33/504 257/98 |
| 2015/0187987 A1* | 7/2015 | Sim | G02F 1/133602 257/98 |
| 2015/0197689 A1* | 7/2015 | Tani | C09K 11/025 362/84 |
| 2015/0241046 A1* | 8/2015 | Hagemann | G03B 21/16 362/84 |
| 2015/0261076 A1* | 9/2015 | Dijken | H01L 33/507 359/326 |
| 2015/0292687 A1* | 10/2015 | Sugiyama | H01S 5/0078 362/259 |
| 2015/0303648 A1* | 10/2015 | Kozuru | H01S 5/005 362/235 |
| 2015/0316233 A1* | 11/2015 | Kawamata | H01L 33/505 362/317 |
| 2015/0318449 A1* | 11/2015 | Rantala | H01L 25/0753 257/76 |
| 2015/0340547 A1* | 11/2015 | Tamaki | H01L 33/504 438/29 |
| 2015/0371975 A1* | 12/2015 | Shimizu | H01L 33/486 257/88 |
| 2016/0013374 A1* | 1/2016 | Dijken | H01L 33/486 257/98 |
| 2016/0053950 A1* | 2/2016 | Li | F21K 9/64 362/84 |
| 2016/0077415 A1* | 3/2016 | Motoya | G03B 21/204 353/84 |
| 2016/0190418 A1* | 6/2016 | Inomata | H01L 33/644 257/98 |
| 2016/0247976 A1* | 8/2016 | Rudmann | H01L 27/14618 |
| 2016/0268488 A1* | 9/2016 | Goeoetz | C09K 11/7774 |
| 2016/0351760 A1* | 12/2016 | Hayashi | H01L 33/58 |
| 2017/0025584 A1* | 1/2017 | Lee | H01L 33/56 |
| 2017/0137328 A1* | 5/2017 | Kelso | C09K 11/7774 |
| 2017/0179359 A1* | 6/2017 | Lunz | F21V 29/70 |

FOREIGN PATENT DOCUMENTS

| | | | |
|---|---|---|---|
| JP | 2009071005 A * | 4/2009 | G02B 19/0095 |
| JP | 2009071254 A * | 4/2009 | |
| JP | 2009277843 A * | 11/2009 | |
| JP | 2011108889 A * | 6/2011 | |
| JP | 2011109010 A * | 6/2011 | |
| JP | 2012094419 A * | 5/2012 | |
| JP | 2013038215 A * | 2/2013 | |
| JP | 2013074273 A * | 4/2013 | H01L 24/97 |
| JP | 2013115351 A * | 6/2013 | |
| JP | 2013207049 A * | 10/2013 | |
| JP | 2013214426 A * | 10/2013 | |
| JP | 2014017459 A * | 1/2014 | |
| KR | 20120009686 A * | 2/2012 | |
| KR | 20130057676 A * | 6/2013 | H01L 33/44 |
| WO | WO-2008105428 A1 * | 9/2008 | H01L 33/644 |
| WO | WO-2009115976 A1 * | 9/2009 | G02B 19/0095 |
| WO | WO-2010049875 A1 * | 5/2010 | H01S 3/005 |
| WO | WO-2011004795 A1 * | 1/2011 | H01L 33/44 |
| WO | WO-2011123987 A1 * | 10/2011 | H05B 33/04 |
| WO | WO-2012053386 A1 * | 4/2012 | H01L 33/507 |
| WO | 2012108291 A | 8/2012 | |
| WO | WO-2013144053 A1 * | 10/2013 | F21V 29/004 |
| WO | WO-2013175706 A1 * | 11/2013 | H01L 33/644 |
| WO | WO-2015003402 A1 * | 1/2015 | H01L 33/508 |

OTHER PUBLICATIONS

Wolfram, Thermal Conductivity of the elements, Apr. 2012 (Wayback Machine Verified) (Year: 2012).*

Indium Corporation, Alloy Thermal Conductivity, May 2008 (Year: 2008).*

Valley Design Corp., Typical Properties of Sapphire Wafers and Substrates, 2015 (Year: 2015).*

Lambert et al., Embedding Quantum Dot Monolayers in Al2O3 Using Atomic Layer Deposition, Dec. 2010, Chemistry of Materials, vol. 23(2), pp. 126-128 (Year: 2010).*

Reinert et al., Chapter 32—Metallic Alloy Seal Bonding, Micro and Nano Technologies (Year: 2015).*

Coe-Sullivan, S., "Quantum Dots: Transformational Color for Lighting and Displays," Phosphor Global Summit, Mar. 21, 2012, 46 pages.

Kahen, K., "High-Efficiency Colloidal Quantum Dot Phosphors," DOE SSL R&D Workshop, Long Beach, California, Jan. 29-31, 2013, 12 pages.

Kahen, K.B. et al., "Colloidal Nanocrystal Emitters for LED Phosphors," Eastman Kodak Company, Phosphor Global Summit, 2012, 15 pages.

Li, K., "High-Power Laser Phosphor Light Source with Liquid Cooling for Digital Cinema Applications," Proceedings of SPIE, vol. 9005, Abstract Only, Feb. 25, 2015, p. 900507.

* cited by examiner

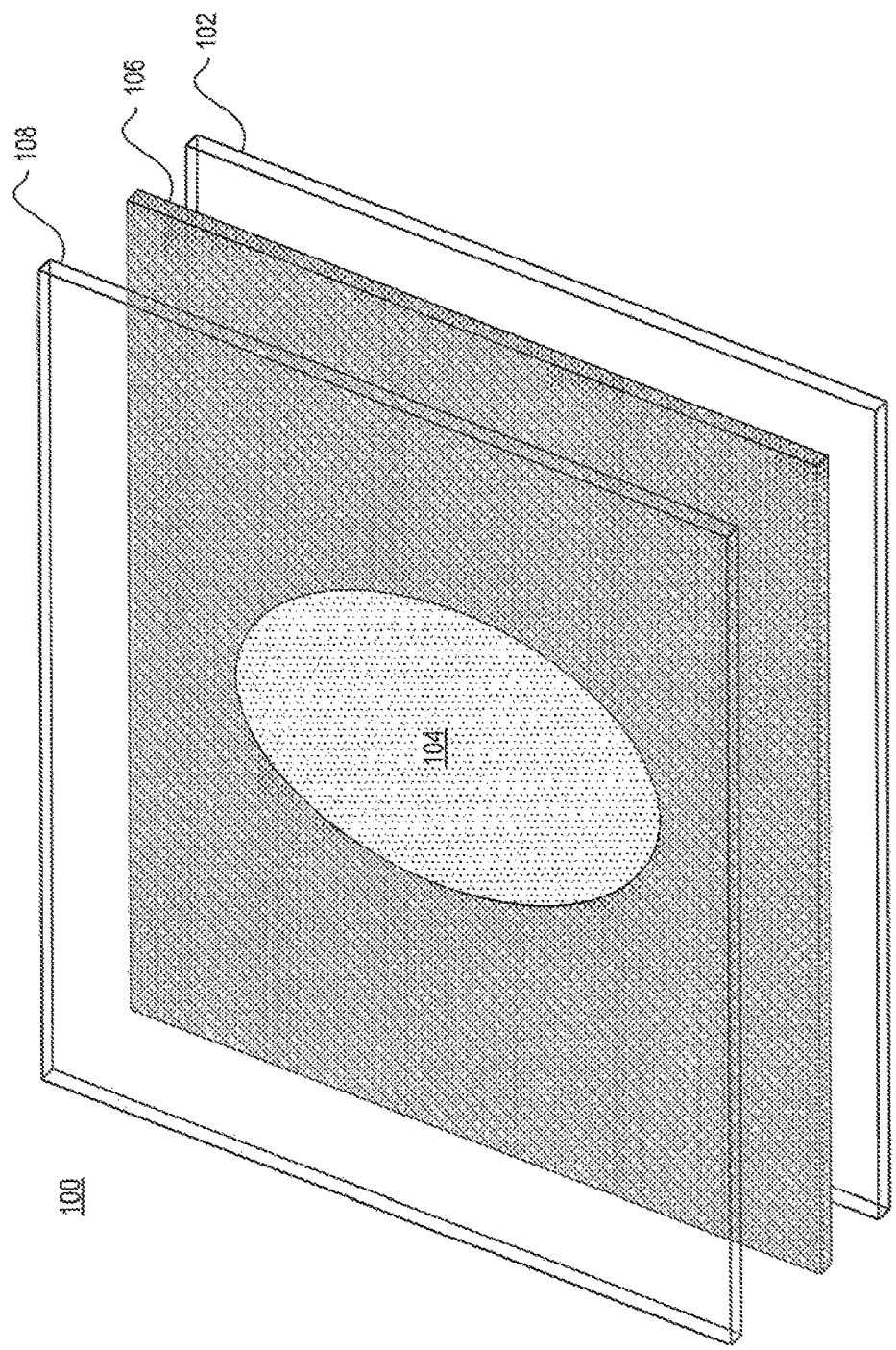

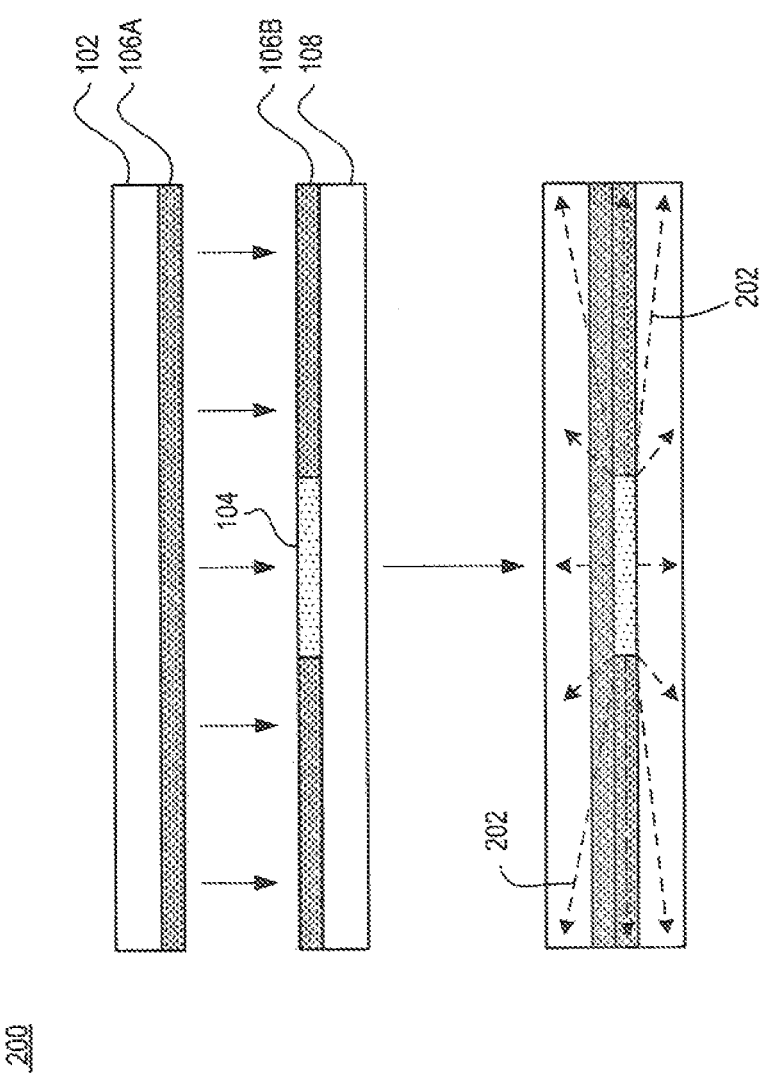

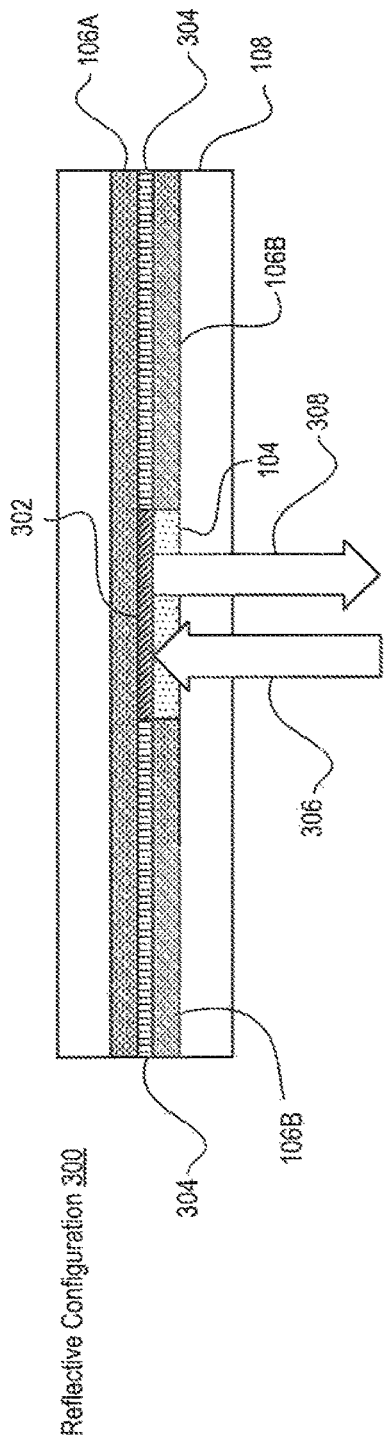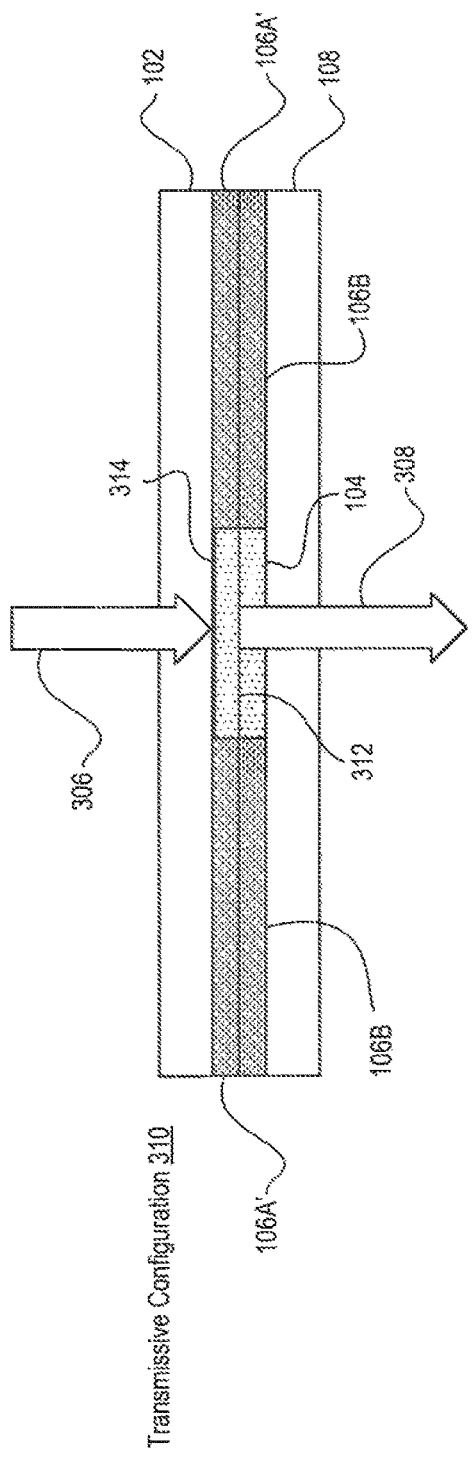

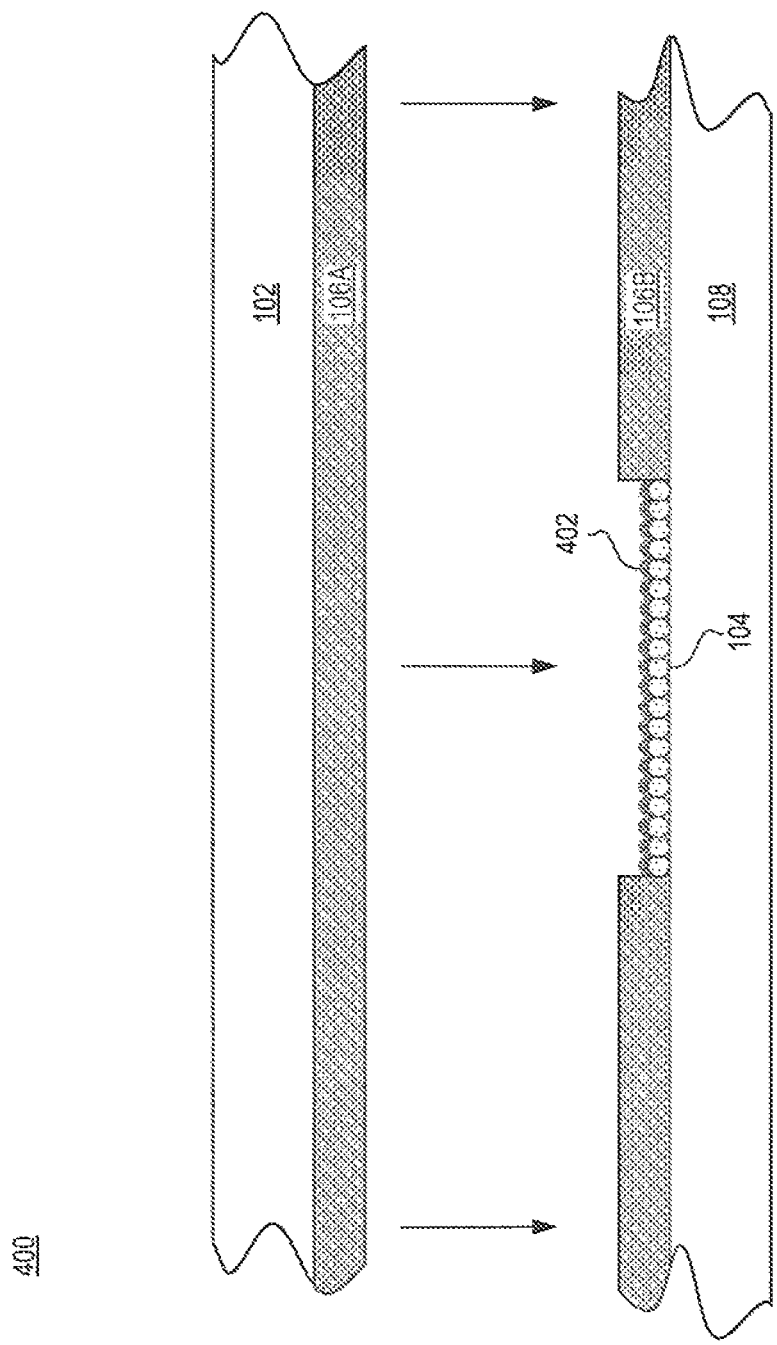

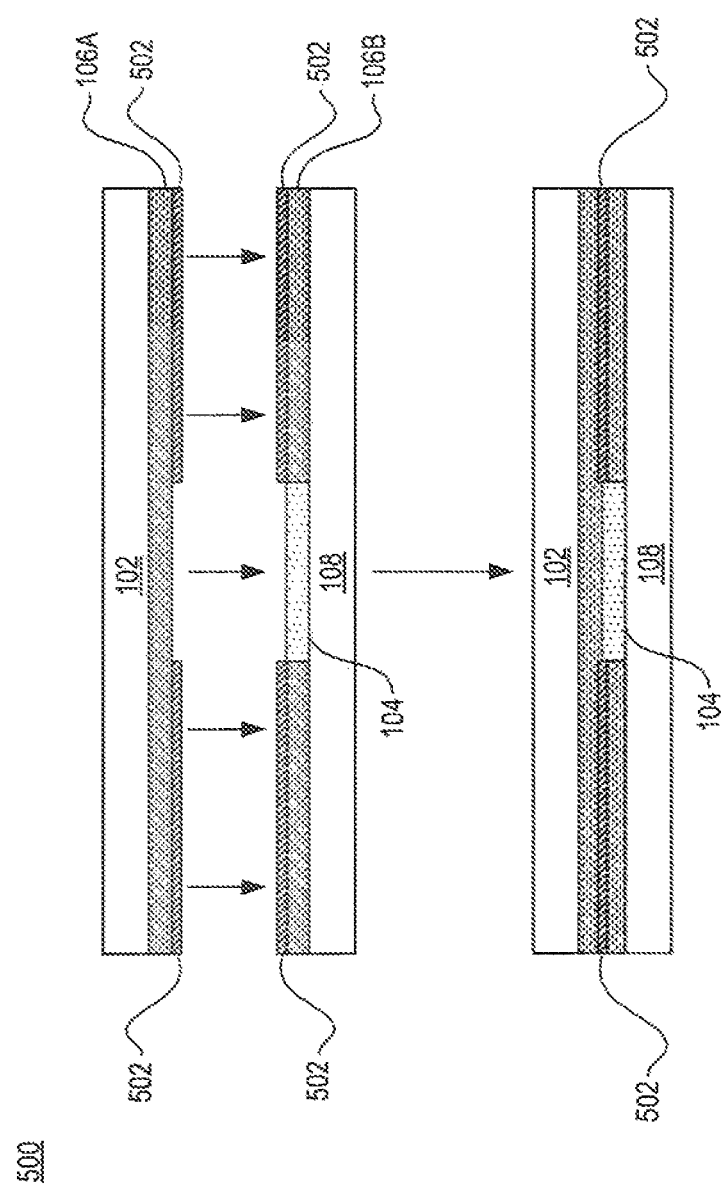

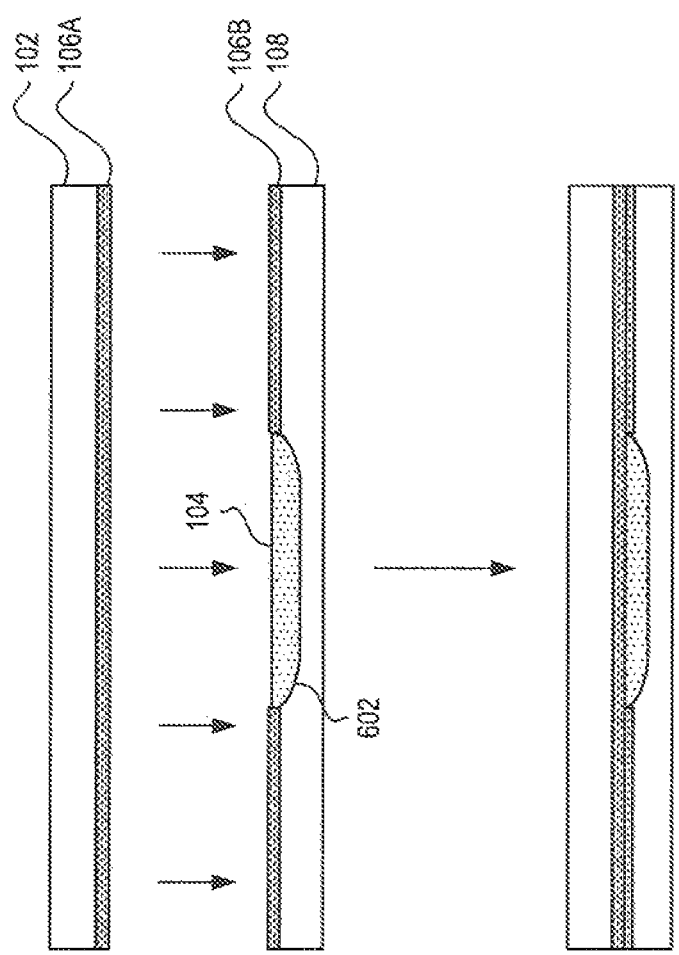

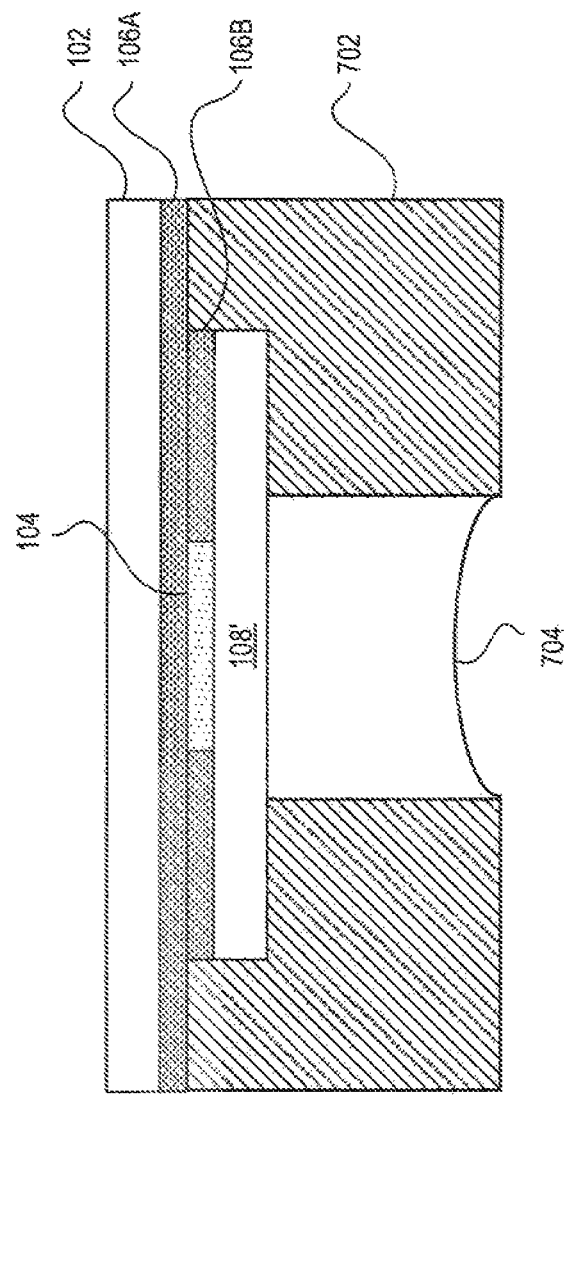

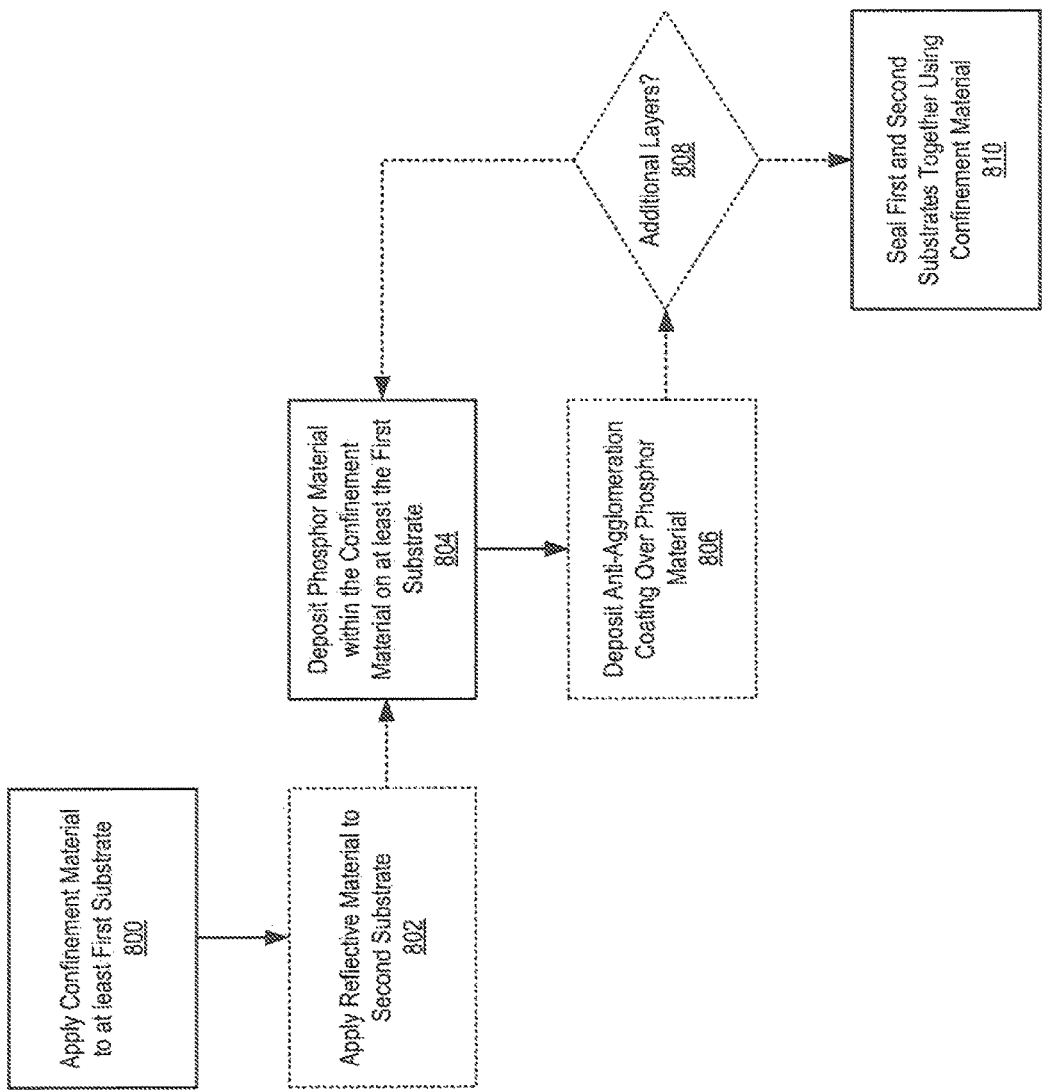

LIGHT CONVERTER ASSEMBLIES WITH ENHANCED HEAT DISSIPATION

CROSS-REFERENCE TO RELATED APPLICATIONS

This application is a National Stage application of, and claims priority to, International Application No. PCT/US2015/019762, filed Mar. 10, 2015, which claims the benefit of U.S. Provisional Application No. 61/950,920, filed Mar. 11, 2014, the entire contents of both of which are hereby incorporated herein by reference.

TECHNICAL FIELD

The present invention relates to light emitting devices, and more specifically, to heat-efficient device assemblies for light conversion.

BACKGROUND

There currently exists a demand for electronic devices capable of emitting light with low etendue. Etendue is a measure of how a light beam spreads in area and angle as it propagates. Low etendue light may be characterized by minimal spreading of a light beam over distance such as in, for example, laser light. Devices that emit low etendue light may be employed in a variety of optical display or projection systems. One such device generates high luminance colored light sources utilizing focused or tightly-collimated laser excitation. For example, laser-activated remote phosphor (LARP) devices may generate a low etendue light emission by converting the light from an incident laser beam into a longer wavelength emission (so-called down-conversion) by employing a phosphor target. However, at least one issue with LARP devices is the heat generated by the down-conversion (Stokes shift) and other non-radiative losses within the phosphor that may lead to degradation or thermal quenching of the phosphor. Existing LARP devices may employ mechanical means such as, for example, phosphor powder embedded in silicone on a rotating and reflective color wheel to avoid overheating by minimizing duty cycle. However, this approach requires additional mechanical components that must maintain very tight tolerances, and large amounts of phosphor. Alternative approaches employ luminescent ceramic plates attached to heat conductive substrates with heat-resistant silicone adhesives. This solution is also problematic in that the silicone adhesives that maintain the optical transparency needed in LARP devices are poor heat conductors, and thus, overheating remains a problem.

SUMMARY

It is an object of the invention to obviate the disadvantages of the prior art.

It is another object of the invention to provide a light converter assembly with enhanced heat dissipation.

It is a further object of the invention to provide a light converter assembly that provides a hermetically sealed environment for a phosphor material, and in particular a quantum dot material.

In accordance with one object of the invention, there is provided a light converter assembly, comprising a first substrate and a second substrate; the first and second substrates comprising a light transmissive, thermally conductive material; a phosphor material disposed between the first and second substrates; and a confinement material surrounding the phosphor material and bonding the first and second substrates together to hermetically seal the phosphor material between the first and second substrates; the confinement material having a thermal conductivity greater than a thermal conductivity of the first and second substrates.

In accordance with another object of the invention, the confinement material comprises two layers wherein a first layer of the confinement material is deposited on a surface of the first substrate and a second layer of confinement material is deposited on a surface of the second substrate; and the light converter assembly further comprises a heat sink attached to the first substrate and the second layer of confinement material on the second substrate, the second substrate being larger than the first substrate and the heat sink having an aperture positioned so that an excitation beam may impinge on the phosphor material.

BRIEF DESCRIPTION OF THE DRAWINGS

Reference should be made to the following detailed description which should be read in conjunction with the following figures, wherein like numerals represent like parts:

FIG. 1 illustrates an exploded perspective view of an example light converter assembly consistent with the present disclosure;

FIG. 2 illustrates in cross section an example assembly configuration consistent with the present disclosure;

FIGS. 3A and 3B illustrate in cross section examples of reflective and transmissive assembly configurations, respectively, consistent with the present disclosure.

FIG. 4 illustrates in cross section an example of the application of a coating to prevent agglomeration consistent with the present disclosure;

FIG. 5 illustrates in cross section an example assembly configuration comprising bonding facilitator material consistent with the present disclosure;

FIG. 6 illustrates in cross section an example assembly configuration comprising a recess for receiving phosphor material consistent with the present disclosure;

FIG. 7 illustrates in cross section an example assembly configuration comprising a different sized substrates for receiving a heat sink component consistent with the present disclosure; and FIG. 8 illustrates example operations for assembly of a light converter assembly consistent with the present disclosure.

Although the following Detailed Description will proceed with reference being made to illustrative embodiments, many alternatives, modifications and variations thereof will be apparent to those skilled in the art.

DETAILED DESCRIPTION

The present disclosure is directed to light converter assemblies with enhanced heat dissipation. An example light converter assembly may comprise a confinement material applied to a surface of a first substrate and a phosphor material also deposited on the first surface so as to be surrounded by the confinement material. The first substrate may be sealed to a second substrate using the confinement material so that the phosphor material is confined between the substrates. The substrates may comprise, for example, sapphire to allow for light beam transmission and heat conductance. Confinement materials that may be employed to seal the first substrate to the second substrate may include, for example, silicon or a metal (e.g., silver, copper, aluminum, etc.) to provide high heat conductance and preferably an airtight seal to prevent atmospheric contamination of the phosphor material. The phosphor material may comprise any known organic or inorganic phosphor material. Preferably, the phosphor material is comprised of quantum dots. Example assembly configurations may comprise, for example, sizing the phosphor deposition on the first surface based on an area of an excitation beam to be applied to the phosphor material, quantum dots being deposited substantially in monolayers with or without a coating to prevent agglomeration of the quantum dots, the first and second substrates having different sizes with or without the addition of components such as heat sinks to enhance heat dissipation, the addition of materials such reflective material, bonding facilitator material, etc.

In one embodiment, a light converter assembly may comprise, for example, at least a first substrate, a second substrate, a phosphor material and a confinement material. The phosphor material may be deposited on at least a surface of the first substrate. The confinement material may be applied to at least the first substrate in an area surrounding the phosphor material. It may also be applied in a similar fashion to the second substrate. The confinement material may provide one or more of several useful functions in the various embodiments of the invention described herein including confining the phosphor material between the first and second substrates, bonding the substrates together, forming a reflective surface, providing high heat conduction between the substrates to promote heat dissipation, and generating a hermetic seal to isolate the phosphor material from the ambient atmosphere. (As used herein, a hermetic seal, or hermetically sealing, generally refers to a seal, or forming a seal, that is airtight.)

In at least one example implementation, at least one of the first and second substrates may comprise sapphire. Preferably, the confinement material has a thermal conductivity greater 10 W/m/K, and more preferably greater than the thermal conductivity of the substrate material, even more preferably the confinement material has a thermal conductivity of at least 100 W/m/K (e.g., silicon, aluminum, silver, copper, etc.). The confinement material preferably has a low gas permeability to protect the phosphor material from atmospheric contamination. The phosphor material preferably comprises at least one quantum dot material including at least one of core/shell structures or giant thick shell structures. For example, the phosphor material may comprise a plurality of quantum dots deposited substantially in monolayers. In this instance, the phosphor material may further comprise at least one layer of a coating (e.g., aluminum oxide) to prevent agglomeration of the plurality of quantum dots.

In the same or a different implementation, the phosphor material may be deposited over an area on the surface equal to or larger than a cross-sectional area of an excitation beam employed to excite the phosphor material. The light converter assembly may also comprise a reflective material applied in an area corresponding to at least the area of the phosphor material deposited on the first substrate. The phosphor material may further be deposited on the surface of the second substrate in an area within the confinement material corresponding to at least the area of the phosphor material deposited on the first substrate. The light converter assembly may further comprise a bonding facilitator material to facilitate bonding of the first and second substrates. In at least one example implementation, a recess may be formed in the first substrate, the phosphor material being deposited into the recess in the first substrate. In the same or a different implementation, a heat sink may be coupled to at least one of the first and second substrates. An example method consistent with the present disclosure may comprise applying a confinement material to at least a first substrate, depositing a phosphor material on at least the surface of the first substrate so that the confinement material surrounds the phosphor material; and sealing the first surface to a second substrate using the confinement material.

FIG. 1 illustrates an example light converter assembly consistent with the present disclosure. Initially, it is important to note that the light converter assemblies disclosed herein are merely examples provided for the sake of explanation. Deviations as to element placement, orientation, composition, shape, size, etc. may still be consistent with the teachings of the present disclosure. These representations may also comprise components that vary in relative scale (e.g., size with respect to each other), as the relative scale of the components may change depending on a variety of factors including, for example, the component material makeup, the requirements of the application for which the device is being manufactured, the manufacturing process, etc.

Example light converter assembly 100 is disclosed in FIG. 1. Light converter assembly 100 is shown exploded (e.g., with components separated) for clarity. Light converter assembly 100 may comprise, for example, first substrate 102, phosphor material 104, confinement material 106 and second substrate 108. Substrates 102 and 108 may comprise a light transmissive, heat conductive material such as, for example, sapphire. While substrate 102 and substrate 108 have both been represented as transparent sapphire plates in light converter assembly 100 as disclosed in FIG. 1, it is not necessary for both substrate 102 and substrate 108 to be composed of the same material, or event to possess the same physical properties. Although the substrates may have other shapes or sizes, it is preferred that the first and second substrates be constructed in the form of flat plates, for example the rectangular plates shown in FIG. 1 In one embodiment, the plates may have a size of 10 mm×10 mm with a thickness of 0.5 mm. In the case of sapphire, it is preferred that the plates have a thickness of about 10 microns to about 2 mm and a major surface area of at least about 1 mm².

Phosphor material 104 preferably comprises at least one quantum dot material. Generally, a quantum dot material comprises nanocrystals of a material (e.g., a semiconductor material) that are of a size small enough to display quantum confinement properties. Due to the quantum confinement effects, the energy differences between electronic states of a quantum dot are a function of both the composition and the physical size of the quantum dot. Thus, the optical and optoelectronic properties of quantum dots can be tuned and adjusted by changing the physical size of the quantum dots. More preferably, the material of quantum dots may be inorganic semiconductor nanocrystals comprising Group IV elements, Group II-VI compounds, Group II-V compounds, Group III-VI compounds, Group III-V compounds, Group IV-VI compounds, Group compounds, Group II-IV-VI compounds, or Group II-IV-V compounds, alloys thereof and/or mixtures thereof, including ternary and quaternary alloys and/or mixtures. Examples include, but are not limited to, ZnO, ZnS, ZnSe, ZnTe, CdO, CdS, CdSe, CdTe, HgO, HgS, HgSe, HgTe, AlN, AlP, AlAs, AlSb, GaN, GaP, GaAs, GaSb, GaSe, InN, InP, InAs, InSb, TlN, TlP, TlAs, TlSb, PbO, PbS, PbSe, PbTe, alloys thereof, and/or mixtures thereof, including ternary and quaternary alloys and/or mixtures. The quantum dots may be doped, such as ZnSe:Mn, whose emission is related to both the dopant and the size of the quantum dots. The quantum dots may have a core/shell structure. Quantum dots cores, which can be made from any of the above materials, typically lose some quantum efficiency due to the non-radiative processes at the surface defects, such as dangling bonds. Ligands may passivate some of them but not efficiently enough. Overcoating of the core with a shell of larger bandgap material, such as ZnSe or ZnS, results in passivation of surface defects and an increase of the quantum efficiency. The quantum dots also may be overcoated with ligands to prevent aggregation in the matrix. The ligands may be crosslinked to form polymeric micelles around the quantum dots. Colloidal quantum dots may exhibit narrow-band emission (e.g., saturated color) along with broad absorption spectrum (e.g., the quantum dot may be usable with a broad range of excitation sources). When employed in a LARP device, an excitation beam (e.g., a laser beam) causes the quantum dot material to generate a light emission having characteristics different that the excitation beam. The characteristics of the light emission (e.g., etendue, color, intensity, etc.) may be controlled based on the composition of the quantum dots. For example, the peak emission wavelength of the quantum dots may be tuned to within nanometers based on nanocrystal size, material composition, architecture of the core/shell structure, etc. Further to generating a light emission via laser excitation as in LARP (e.g., using a laser diode), other light sources that may be employed to generate an excitation beam may comprise, for example, a light emitting diode (LED) such as a high flux LED, etc.

Confinement material 106 may be composed of a variety of materials based on desired functional characteristics. The desirable functional characteristics may comprise, for example, the ability to seal substrate 102 to substrate 108, high heat conductance, low gas permeability, etc. More specifically, the performance of light converter assembly 100 may benefit if the longitudinal heat transfer coefficient of the confinement material 106, $h_c = \kappa_c/l > 10^6$ W/m²/K, where $\kappa_c$ is the longitudinal thermal conductivity of the confinement material, and l is the thickness of the confinement material. For typical LARP conditions with absorbed laser flux densities of $10^7$ W/m² and a confinement material thickness of 5 μm, this translates into a temperature difference across the phosphor material on the order of 10K. This estimate takes the area over which most of the longitudinal heat transfer occurs is roughly equal to the area of the laser spot A. Therefore the temperature difference $\Delta T \approx P/Ah_c$, where P is the laser power and $\Delta T$ is the temperature difference across the phosphor. The minimal $\kappa_c$ in this case is 5 W/m/K. In order to ensure proper heat dissipation, the confinement material 106 should have a thermal conductivity of at least 10 W/m/K, which is substantially above that of typical organic bonding materials. If the substrate material thickness is much thinner than the laser spot size, then the estimate above underestimates the temperature difference and it is preferable to have $\kappa_c$ be greater than the thermal conductivity of the first and second substrate materials, and more preferably $\kappa_c > 100$ W/m/K. Low gas permeability may isolate phosphor material 104 from atmospheric contamination (e.g., which may reduce conversion efficiency). The linear coefficient of thermal expansion for confinement material 106 may also be considered if, for example, larger temperature variations are possible (e.g., based on the particular application for which light converter assembly 100 is intended). Confinement layer composition will be discussed with respect to FIG. 2-7.

Confinement material 106 may be applied to a surface of substrates 102 and/or 108 using a variety of application methods, preferably in one or more layers as shown. For example, confinement material 106 may be applied on a surface via a silicon-to-sapphire wafer bond, or may be deposited on a surface via evaporation, epitaxy, chemical vapor deposition (CVD), physical vapor deposition (PVD), sputtering etc. When being applied to a surface, confinement material 106 may be patterned to leave openings for the later deposition of phosphor material 104. Patterning may be performed by, for example, photolithography or selective deposition (e.g., wherein some sacrificial material may be pre-deposited in the area intended for deposition of the QDs), etc. Final sealing may occur at a relatively low temperature to avoid damaging phosphor material 104. For example, wafer bonding silicon-to-sapphire may generate clean and smooth silicon surfaces for use in sealing (e.g., fusing) substrate 102 to substrate 108 at a temperature that would be safe for phosphor material 104. Confinement material 106 may be configured as a single layer or multiple layers bonded together to create an area on the surface of substrate 102 or substrate 108 that confines phosphor material 104. Preferably, the layer of the confinement material covers at least about 50% of the surface of the side of the substrate to which it is applied. More preferably, the coverage is at least about 75% and most preferably at least about 90% of the surface of the side of the substrate to which it is applied. In a preferred embodiment, the confinement material fills the entire space between the substrates with the exception of the region where the phosphor is deposited. As shown in FIG. 1, confinement material 106 surrounds a substantially circular area that allows phosphor material 104 to be confined between substrates 102 and 108 when sealed together. In this manner, phosphor material 104 may be confined within a fixed location within light converter assembly 100 in a way that allows heat generated during excitation to be conducted away from phosphor material 104 to avoid, for example, a drop in efficiency due to overheating.

It is important to note that fabrication of the disclosed optical components may be done on an industrial scale. A variety of methods may be utilized. In particular, confinement material 106 (e.g., silicon or a metal such as aluminum, copper or silver) may be applied to the surface of substrates 102 and/or 108 with precise thickness and uniformity. Microelectronics industry methods may provide such capability. Silicon is a preferred material given its high thermal conductivity, moderate thermal expansion coefficient compared to the sapphire and the ready-to-use technologies available for making silicon-on-sapphire substrates such as low temperature wafer bonding. Moreover, deposition of quantum dots can be done by mass production methods such as inkjet printing, layer transfer etc.

FIG. 2 illustrates an example assembly configuration consistent with the present disclosure. Example configuration 200 presents a side view of an example configuration for light converter assembly 100. In the embodiment disclosed in FIG. 2, a layer of confinement material 106A may be applied to substrate 102. Confinement layer 106A may comprise, for example, metals such as silver, gold, aluminum or combinations thereof. Confinement layer 106A may also be an optical thin-film dielectric stack wherein the outermost contacting layer may comprise silicon dioxide ($SiO_2$) or a similar material that can bond to confinement layer 106B. Confinement material 106B may comprise, for example, silicon, various pure metals or alloys, a dielectric, etc., that may be applied to substrate 108 with an area left exposed in which phosphor material 104 may be deposited. Following deposition of phosphor material 104, substrate 102 may sealed together with substrate 108 using confinement material 106A and 106B (e.g., utilizing a low temperature bonding technique such as a metal-to-metal bond, a silicon-to-silicon bond, etc.). Dashed arrows 200 demonstrate how heat may be dissipated during device operation. In this manner the desired light output may be achieved while avoiding the overheating of phosphor material 104.

FIGS. 3A and 3B illustrates examples of reflective and transmissive assembly configurations, respectively, consistent with the present disclosure. Reflective configuration 300 demonstrates an assembly that may receive excitation beam 306 and generate light emission 308 from the same side of a light converter assembly through reflection. In at least one example implementation, reflective material 302 may be located between the substrates 102, 108 in an area corresponding to at least the area of deposition of phosphor material 104 on the surface of substrate 108. In one embodiment, reflective material 302 is first applied to confinement material 106A before the substrates are bonded together. However, reflecting material 302 alternatively may be applied over phosphor material 104 prior to bonding the substrates. Reflective material 302 may be optically reflective and optically isolated from the layer of confinement material 106A. As a result, confinement layer 106A does not have to be optically non-absorbing. Reflective material 302 may comprise, for example, metals such as silver, aluminum, or gold that also include dielectric layers for protection or reflectively enhancement. A dichroic material may be used instead of a totally reflective layer to reflect only a certain bandwidth of light. Material 304 surrounding reflective material 302 may be, for example, the same material as reflective material 302 or confinement material 106A, or may be a material to facilitate bonding to confinement material 106B.

Transmissive configuration 310 may be configured to receive excitation beam 306 from one side of a light converter assembly and generate light emission 308 from the opposite side of the light converter assembly or both sides of the light converter assembly. For example, unidirectional emission may be achieved by applying a dichroic coating 314 to the excitation side of the light converter assembly. The dichroic coating will pass the short wavelength excitation beam 306 while reflecting longer-wavelength, backward-directed light emissions from phosphor material 104. To avoid spatial expansion of any backward-directed light emissions because of light propagation within the substrate, the dichroic coating 314 may be applied to the surface of substrate 102 proximate to phosphor material 104. In one embodiment, additional phosphor material 312 may also be deposited on substrate 102 over an area corresponding to at least the area over which phosphor material 104 is deposited on the surface of substrate 108 (e.g., confinement material 106A' may be patterned similar to confinement material 106B to reserve this area for deposition of additional phosphor material 312). Since substrates 102 and 108 may be composed of a light transmissive material (e.g., sapphire), excitation beam 306 may be received through substrate 102, converted by additional phosphor material 312 and/or phosphor material 104, and emitted as light emission 308 through substrate 108. In a preferred embodiment, excitation beam 306 and light emission 308 pass through substrates 102, 108 without being substantially absorbed or scattered. As in example 300, confinement material 106A and 106B does not have to be optically non-absorbing and may comprise, for example, silicon, gold, silver, copper, or aluminum. It is important to note that the example assembly configurations disclosed in FIG. 2 and FIG. 4-7 are able to be configured in reflective configuration 300 and/or transmissive configuration 310 depending on, for example, the particular parameters of the application for which the light converter assembly is intended.

FIG. 4 illustrates an example of the application of a coating to prevent agglomeration of quantum dots consistent with the present disclosure. One embodiment consistent with the present disclosure may employ a layer of quantum dots. These quantum dots may be held in place with respect to each other by only ligands (e.g., natural molecular binding). To reduce the risk of loss of the ligands and agglomeration of quantum dot nanocrystals, which in turn may result in a loss of efficiency for phosphor material 104, thick shell quantum dots (e.g., giant quantum dots) may be employed. The properties of giant quantum dots may not be dependent upon the dispersing medium. Alternatively, agglomeration may be prevented through the deposition of coating 402 over phosphor material 104 which may be substantially a monolayer of quantum dots. The quantum dots may be substantially deposited in a monolayer in that it may be possible for voids or localized excesses existing in a monolayer of quantum dots to be tolerated depending on, for example, the required operational characteristics of light converter assembly (e.g., the intensity of the light emission, the efficiency of light conversion, etc.) For example, coating 402 may be a transparent oxide (e.g., aluminum oxide) used to set a monolayer of quantum dots in a fixed position. The deposition of coating 402 may be performed utilizing a variety of low-temperature methods (e.g., atomic layer deposition (ALD)). The transparent oxide may encapsulate phosphor material 104 in place. The deposition of phosphor material 104 and application of coating 402 may be repeated multiple times to form a multilayer structure capable of providing the desired emission intensity or conversion efficiency.

FIG. 5 illustrates an example assembly configuration comprising bonding facilitator material consistent with the present disclosure. In example configuration 500, bonding facilitator material 502 may be applied over confinement material 106A and/or confinement material 106B to facilitate the sealing of substrates 102 and 108 when light converter assembly 500 is assembled while still being able to conduct heat away from phosphor material 104. The use of bonding facilitator material 502 may allow for a larger range of materials to be employed in confinement materials 106A and 106B since confinement materials 106A and 106B no longer need to be bondable to each other. Bonding facilitator material 502 may be comprised of materials that are able to form a strong bond at a relatively low temperature to protect phosphor material 104 from being damaged while at least maintaining (e.g., at least not substantially degrading) the overall thermal conductivity of the light converter assembly. Example materials may include silicon, silicon dioxide ($SiO_2$), copper, etc. Bonding facilitator material 502 may be applied over confinement material 106A and/or confinement material 106B using various deposition processes such as, for example, sputtering, CVD, etc.

FIG. 6 illustrates an example assembly configuration comprising a recess for receiving phosphor material consistent with the present disclosure. Example configuration 600 comprises a configuration similar to example configuration 200 with the exception of recess 602 being formed in the surface of substrate 108 to receive the deposition of phosphor material 104. Recess 602 may be chemically etched, machined, etc. into substrate 108. While the disclosed embodiment shows the sealing of substrate 102 to substrate 108 using a confinement material 106A-to-confinement material 106B bond, other embodiments consistent with the present disclosure may include, for example, a single layer of confinement material 106 sealing substrate 102 to substrate 108. The selection of a manufacturing method may be based on a variety of factors including, for example, cost, process time, yield, device performance, etc.

FIG. 7 illustrates an example assembly configuration comprising different sized substrates for receiving a heat sink component consistent with the present disclosure. Example configuration 700 comprises a configuration similar to at least example configuration 200 in FIG. 2. However, example configuration 700 comprises a substrate 108' that is not the same size as substrate 102 (e.g., substrate 108', as disclosed, is smaller than substrate 102) that allows for the addition of heat sink 702 to example configuration 700. Heat sink 702 may directly contact portions of confinement material 106A, confinement material 106B and substrate 108. Direct contact between heat conductive materials in example configuration 700 may result in improved heat dissipation (e.g., heat sink 702 may be comprised of a material having a heat conductance greater than sapphire such as silicon or a metal). In particular, this embodiment should allow for greater dissipation of heat from substrate 102 since a direct path is provided for heat to be conducted away from substrate 102 through confinement material 106A instead of also having to pass through substrate 108 which has a lower thermal conductivity than the confinement material. While heat sink 704 has been shown as directly coupled to substrate 108, it may also be coupled directly to substrate 102. In the illustrated embodiment, opening 704, shown bisected in FIG. 7 to enhance clarity, may be formed in heat sink 702 to allow for the reception of excitation beam 306 and/or transmission of light emission 308 such as shown in FIGS. 3A & 3B. Sizing for opening 704 may depend on, for example, light emission 308, the area over which phosphor material 104 is deposited on substrate 108'.

FIG. 8 illustrates example operations for assembly of a light converter assembly consistent with the present disclosure. In operation 800 a confinement material may be applied to at least a surface of a first substrate. Confinement material may also be applied to a surface of a second substrate. In this instance, some configurations consistent with the present disclosure may optionally comprise operation 802 wherein a fully reflective or dichroic material/coating may be deposited over at least a part of the confinement material residing on the second substrate to allow for reflective mode operation. A phosphor material may then be deposited on the first substrate so that the confinement material surrounds the phosphor material in operation 804. Operations 806 to 808 may also be optional in that the application of a coating for to prevent agglomeration may not be necessary or even desirable in some devices. In operation 806 a coating may be deposited over the phosphor material (e.g., a monolayer of quantum dots). A determination may then be made in operation 808 as to whether additional monolayers of quantum dots still need to be deposited. Operations 806 to 808 may be repeated until all of the phosphor material has been deposited. In operation 810 the first substrate may be sealed to a second substrate using the confinement material. Sealing the first substrate to the second substrate confines the phosphor material between the first and second substrates allowing, for example, a light emission to be generated by exciting the phosphor material with an excitation beam.

While FIG. 8 illustrates various operations according to an embodiment, it is to be understood that not all of the operations depicted in FIG. 8 are necessary for other embodiments. Indeed, it is fully contemplated herein that in other embodiments of the present disclosure, the operations depicted in FIG. 8, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A light converter assembly comprising:
a first substrate and a second substrate, the first and second substrates comprising a light transmissive, thermally conductive material;
a phosphor material disposed between the first and second substrates;
a confinement material disposed between the first and second substrates, the confinement material surrounding the phosphor material and bonding the first and second substrates together to hermetically seal the phosphor material between the first and second substrates,
wherein the confinement material has a thermal conductivity greater than 10 W/m*K,
wherein the confinement material comprises two layers, and
wherein a first layer of the confinement material is deposited on a surface of the first substrate and a second layer of the confinement material is deposited on a surface of the second substrate; and
a heat sink attached to the second substrate and the first layer of the confinement material on the first substrate, wherein the first substrate is larger than the second substrate such that an interfacial area of the first substrate and the heat sink is increased, and wherein the heat sink comprises an aperture positioned so that an excitation beam is able to impinge on the phosphor material.

2. The light converter assembly according to claim 1, wherein the heat sink covers a side surface of the second layer of the confinement material.

3. The light converter assembly according to claim 1, wherein the phosphor material is arranged within an opening in the second layer of the confinement material.

4. The light converter assembly according to claim 3, wherein a further opening, aligned with the opening in the second layer of the confinement material, is formed in the first layer of the confinement material, wherein the phosphor material is further arranged within the further opening.

5. The light converter assembly according to claim 3, wherein a recess, aligned with the opening in the second layer of the confinement material, is formed in the surface of the second substrate, wherein the phosphor material is further arranged within the recess.

6. The light converter assembly according to claim 3, wherein the first layer of the confinement material covers a top surface of the phosphor material completely, and wherein the second layer of the confinement material covers a side surface of the phosphor material completely.

7. The light converter assembly according to claim 1, wherein the first and second layers of the confinement material covers at least about 50% of the corresponding first and second substrate surface to which it is applied.

8. The light converter assembly according to claim 7, wherein the first and second layers of the confinement material cover at least about 75% of the corresponding first and second substrate surface to which it is applied.

9. The light converter assembly according to claim 8, wherein the first and second layers of the confinement material cover at least about 50% of the corresponding first and second substrate surface to which it is applied.

10. The light converter assembly according to claim 1, wherein the first and second substrates comprise sapphire.

11. The light converter assembly according to claim 10, wherein the confinement material has a thermal conductivity greater than a thermal conductivity of the first and second substrates.

12. The light converter assembly according to claim 10, wherein the confinement material has a thermal conductivity of at least 100 W/m*K.

13. The light converter assembly according to claim 10, wherein the confinement material comprises at least one of silicon, aluminum, silver or copper.

14. The light converter assembly according to claim 13, wherein the first and second substrates are flat plates and the confinement material is silicon.

15. The light converter assembly according to claim 1, wherein the first and second layers of the confinement material have a different composition.

16. The light converter assembly according to claim 1, further comprising a bonding facilitator material, wherein the bonding facilitator material is disposed between the first and second layers of the confinement material.

17. The light converter assembly according to claim 1, further comprising a reflective material located between the first and second substrates in an area corresponding to at least an area of the phosphor material.

18. The light converter assembly according to claim 17, wherein the reflective material has a composition that is the same as the confinement material.

19. The light converter assembly according to claim 1, wherein the phosphor material comprises a plurality of quantum dots deposited substantially in one or more monolayers.

20. The light converter assembly according to claim 19, wherein the phosphor material further comprises at least one layer of a coating to prevent agglomeration of the plurality of quantum dots.

21. The light converter assembly according to claim 20, wherein the coating comprises aluminum oxide.

22. A light converter assembly comprising:
   a first substrate and a second substrate, the first and second substrates comprising a light transmissive thermally conductive material;
   a phosphor material disposed between the first and second substrates; and
   a confinement material disposed between the first and second substrates, the confinement material surrounding the phosphor material and bonding the first and second substrates together to hermetically seal the phosphor material between the first and second substrates,
   wherein the confinement material has a thermal conductivity greater than 10 W/m*K,
   wherein the confinement material comprises two layers,
   wherein a first layer of the confinement material is deposited on a surface of the first substrate and a second layer of the confinement material is deposited on a surface of the second substrate,
   wherein the phosphor material is located in an opening of the second layer of the confinement material,
   wherein the first layer of the confinement material covers a top surface of the phosphor material completely, and
   wherein the second layer of the confinement material covers a side surface of the phosphor material completely.

23. The light converter assembly according to claim 22, further comprising a heat sink coupled to at least one of the first and second substrates.

* * * * *

UNITED STATES PATENT AND TRADEMARK OFFICE
CERTIFICATE OF CORRECTION

PATENT NO. : 10,374,137 B2
APPLICATION NO. : 15/118075
DATED : August 6, 2019
INVENTOR(S) : Maria Anc et al.

Page 1 of 1

It is certified that error appears in the above-identified patent and that said Letters Patent is hereby corrected as shown below:

In the Claims

In Column 11, Line 24, Claim 9, delete "50%" and insert --90%--.

Signed and Sealed this
Eighth Day of October, 2019

Andrei Iancu
*Director of the United States Patent and Trademark Office*